US012660199B2

(12) United States Patent
Heo et al.

(10) Patent No.: US 12,660,199 B2
(45) Date of Patent: Jun. 16, 2026

(54) 3D FERROELECTRIC MEMORY DEVICE

(71) Applicant: Samsung Electronics Co., Ltd., Suwon-si (KR)

(72) Inventors: Jinseong Heo, Suwon-si (KR); Taehwan Moon, Suwon-si (KR); Seunggeol Nam, Suwon-si (KR); Hyunjae Lee, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 290 days.

(21) Appl. No.: 18/340,407

(22) Filed: Jun. 23, 2023

(65) Prior Publication Data

US 2024/0008289 A1      Jan. 4, 2024

(30) Foreign Application Priority Data

Jul. 4, 2022    (KR) ........................ 10-2022-0082134

(51) Int. Cl.
| | |
|---|---|
| *H10B 53/20* | (2023.01) |
| *G11C 11/22* | (2006.01) |
| *H10B 51/20* | (2023.01) |
| *H10B 51/30* | (2023.01) |
| *H10B 53/30* | (2023.01) |

(52) U.S. Cl.
CPC ............ *H10B 53/20* (2023.02); *G11C 11/223* (2013.01); *H10B 51/20* (2023.02); *H10B 51/30* (2023.02); *H10B 53/30* (2023.02)

(58) Field of Classification Search
CPC ........ H10B 51/20; H10B 51/30; H10B 53/20; H10B 53/30; G11C 11/223
See application file for complete search history.

(56) References Cited

U.S. PATENT DOCUMENTS

| | | |
|---|---|---|
| 10,636,471 B2 | 4/2020 | Ramaswamy et al. |
| 10,937,809 B1 | 3/2021 | Sharangpani et al. |
| 11,171,157 B1 | 11/2021 | Lai et al. |

(Continued)

FOREIGN PATENT DOCUMENTS

| | | | | | |
|---|---|---|---|---|---|
| CN | 112470277 A | * | 3/2021 | ........... | G11C 11/225 |
| CN | 117355142 A | * | 1/2024 | ......... | H10D 30/0415 |

(Continued)

OTHER PUBLICATIONS

European Search Report and the European search opinion dated Nov. 2, 2023, issued in European Application No. 23183248.6.

(Continued)

*Primary Examiner* — Matthew E Warren
(74) *Attorney, Agent, or Firm* — HARNESS, DICKEY & PIERCE, P.L.C.

(57) ABSTRACT

Provided is a 3D ferroelectric memory device. The 3D ferroelectric memory device may include a plurality of gate electrodes stacked on a substrate in a first direction; a plurality of ferroelectric layers on the plurality of gate electrodes in a second direction; a plurality of intermediate electrodes on the plurality of ferroelectric layers in the second direction; a first insulating layer between the plurality of gate electrodes and between the plurality of intermediate electrodes; a second insulating layer on the plurality of intermediate electrodes and the first insulating layer; and a channel layer on the second insulating layer.

20 Claims, 17 Drawing Sheets

(56)           References Cited

U.S. PATENT DOCUMENTS

| | | | |
|---|---|---|---|
| 2019/0130957 A1 | 5/2019 | Müller | |
| 2020/0303558 A1* | 9/2020 | Fujii | H10B 43/27 |
| 2021/0358952 A1 | 11/2021 | Makala et al. | |
| 2021/0398993 A1 | 12/2021 | Haratipour et al. | |
| 2022/0036935 A1 | 2/2022 | Wang et al. | |
| 2022/0059549 A1 | 2/2022 | Lai et al. | |
| 2022/0139960 A1* | 5/2022 | Said | H10D 30/701 |
| | | | 257/295 |
| 2023/0371268 A1* | 11/2023 | Müller | H10B 51/20 |
| 2024/0172448 A1* | 5/2024 | Nam | H10D 30/701 |

FOREIGN PATENT DOCUMENTS

| | | | | |
|---|---|---|---|---|
| CN | 119183295 A | * 12/2024 | | H10B 51/30 |
| KR | 2021/0135915 A | 11/2021 | | |
| WO | WO-2021236166 A1 | * 11/2021 | | H10D 30/701 |

OTHER PUBLICATIONS

European Search Report and the European search opinion dated Nov. 3, 2023, issued in European Application No. 23183248.4.

European Office Action dated Aug. 1, 2025 for European Patent Application No. 23183249.4.

European Office Action dated Aug. 1, 2025 for European Patent Application No. 23183248.6.

Office Action dated Sep. 5, 2025 issued in U.S. Appl. No. 18/340,560.

Notice of Allowance dated Feb. 5, 2026 issued in U.S. Appl. No. 18/340,560.

* cited by examiner

3D FERROELECTRIC MEMORY DEVICE

CROSS-REFERENCE TO RELATED APPLICATION

This application is based on and claims priority under 35 U.S.C. § 119 to Korean Patent Application No. 10-2022-0082134, filed on Jul. 4, 2022 in the Korean Intellectual Property Office, the disclosure of which is incorporated by reference herein in its entirety.

BACKGROUND

1. Field

The present disclosure relates to 3D ferroelectric memory devices.

2. Description of the Related Art

Along with the replacement of conventional hard disk drives with solid state drives (SSD), NAND flash memory devices, which are nonvolatile memory devices, have been widely used. Recently, 3D NAND flash memory devices, in which a plurality of memory cells are stacked in a direction perpendicular to a substrate for miniaturization and high integration, have been developed.

In addition, research has recently been conducted into the application of ferroelectric field effect transistors (FeFETs) having characteristics such as a low operating voltage and a high programming speed to 3D NAND flash memory devices.

SUMMARY

Provided are 3D ferroelectric memory devices.

Additional aspects will be set forth in part in the description which follows and, in part, will be apparent from the description, or may be learned by practice of the presented embodiments of the disclosure.

According to an embodiment, a 3D ferroelectric memory device may include a substrate; a plurality of gate electrodes stacked on the substrate in a first direction; a plurality of ferroelectric layers on the plurality of gate electrodes in a second direction; a plurality of intermediate electrodes on the plurality of ferroelectric layers in the second direction; a first insulating layer between the plurality of gate electrodes and between the plurality of intermediate electrodes; a second insulating layer on the plurality of intermediate electrodes and the first insulating layer; and a channel layer on the second insulating layer.

In some embodiments, the first direction may be a direction substantially perpendicular to a surface of the substrate, and the second direction may be a direction substantially parallel to the surface of the substrate.

In some embodiments, the plurality of intermediate electrodes may have depths in the direction substantially parallel to the surface of the substrate, and the plurality of intermediate electrodes may be in contact with the plurality of ferroelectric layers.

In some embodiments, contact areas between the plurality of ferroelectric layers and the plurality of intermediate electrodes may be less than contact areas between the second insulating layer and the plurality of intermediate electrodes.

In some embodiments, in the first direction, the plurality of intermediate electrodes may have widths greater than widths of portions of the plurality of ferroelectric layers in contact with the plurality of intermediate electrodes. In the first direction, the widths of the plurality of intermediate electrodes may be about 1.2 times to about 5 times the widths of the portions of the plurality of ferroelectric layers in contact with the plurality of intermediate electrodes. The plurality of intermediate electrodes may each have widths of about 15 nm to about 100 nm in the first direction.

In some embodiments, the plurality of gate electrodes and the plurality of intermediate electrodes may each independently include at least one of W, TiN, TaN, WN, NbN, Mo, Ru, Ir, RuO, IrO, and polysilicon.

In some embodiments, the first insulating layer may include at least one of SiO, SiOC, and SiON.

In some embodiments, the plurality of ferroelectric layers may surround the plurality of gate electrodes.

In some embodiments, the plurality of ferroelectric layers may include a fluorite-based material, a nitride-based material, or a perovskite.

In some embodiments, the plurality of ferroelectric layers may each have a thickness of about 3 nm to about 20 nm.

In some embodiments, the first insulating layer may have a width between the plurality of intermediate electrodes within a range of about 5 nm to about 20 nm.

In some embodiments, the second insulating layer may include at least one of SiO, SiN, AlO, HfO, and ZrO.

In some embodiments, the channel layer may include a Group IV semiconductor material, a Group III-V semiconductor material, an oxide semiconductor material, a nitride semiconductor material, an oxynitride semiconductor material, a 2D semiconductor material, quantum dots, or an organic semiconductor material.

According to an embodiment, an electronic apparatus may include the 3D ferroelectric memory device.

According to an embodiment, a method of manufacturing a 3D ferroelectric memory device may include alternately stacking a plurality of first insulating layers and a plurality of sacrificial layers in a direction perpendicular to a substrate; forming a channel hole through the plurality of first insulating layers and the plurality of sacrificial layers in the direction perpendicular to the substrate; forming a plurality of first recesses by etching the plurality of sacrificial layers exposed through the channel hole to a given depth in a direction parallel to the substrate; forming a plurality of second recesses by etching portions of the plurality of first insulating layers exposed through the plurality of first recesses; forming a plurality of intermediate electrodes to fill the plurality of second recesses; depositing a second insulating layer and a channel layer sequentially on an inner wall of the channel hole; removing the plurality of sacrificial layers; depositing a plurality of ferroelectric layers on inner walls of spaces from which the plurality of sacrificial layers are removed; and forming a plurality of gate electrodes inside the plurality of ferroelectric layers.

In some embodiments, after the depositing the channel layer on the inner wall of the channel hole, the method may further include forming an oxide layer to fill the channel hole.

In some embodiments, in the direction perpendicular to the substrate, the plurality of intermediate electrodes may have widths greater than widths of the plurality of ferroelectric layers which are in contact with the plurality of intermediate electrodes. In the direction perpendicular to the substrate, the widths of the plurality of intermediate electrodes may be about 1.2 times to about 5 times the widths of the plurality of ferroelectric layers which are in contact with the plurality of intermediate electrodes.

In some embodiments, the plurality of first insulating layers may include at least one selected from the group consisting of SiO, SiOC, and SiON.

In some embodiments, plurality of sacrificial layers may include SiN.

The second insulating layer may include at least one selected from the group consisting of SiO, SiN, AlO, HfO, and ZrO.

In some embodiments, channel layer may include a Group IV semiconductor material, a Group III-V semiconductor material, an oxide semiconductor material, a nitride semiconductor material, an oxynitride semiconductor material, a 2D semiconductor material, quantum dots, or an organic semiconductor material.

In some embodiments, plurality of ferroelectric layers may include a fluorite-based material, a nitride-based material, or a perovskite.

In some embodiments, plurality of gate electrodes and the plurality of intermediate electrodes may each independently include at least one selected from the group consisting of W, TiN, TaN, WN, NbN, Mo, Ru, Ir, RuO, IrO, and polysilicon.

According to an embodiment, a 3D ferroelectric memory device may include a substrate; a plurality of channel layers spaced apart from each other on a surface of the substrate, the plurality of channel layers including a first channel layer and a second channel layer spaced apart from each other in a first direction, the first direction parallel to the surface of the substrate and crossing a second direction that is parallel to the surface of the substrate, and the plurality of channel layers extending in a third direction that is perpendicular to the surface of the substrate; a plurality of gate insulating layers on the surface of the substrate and extending along the plurality of channel layers, respectively, in the third direction, and the plurality of gate insulating layers including a first gate insulating layer and a second gate insulating layer extending along the first channel layer and the second channel layer, respectively, and the first gate insulating layer and the second gate insulating being between the first channel layer and the second channel layer in the first direction; a plurality of gate structures spaced apart from each other on the surface of the substrate, each of the plurality of gate structures including a ferroelectric layer covering a gate electrode, and a first stack of the plurality of gate structures being spaced apart from each other in the third direction and spaced apart from the first gate insulating layer and the second gate insulating layer in the first direction; a plurality of intermediate electrodes spaced apart from each other on the surface of the substrate, widths of the plurality of intermediate electrodes in the third direction being greater than widths of the plurality of gate structures in the third direction, a first stack of the plurality of intermediate electrodes being spaced apart from each other in the third direction along the first gate insulating layer, a second stack of the plurality of intermediate electrodes being spaced apart from each other in the third direction along the second gate insulating layer, and the first stack of the plurality of intermediates electrodes being spaced apart from the second stack of the plurality of intermediate electrodes in the first direction with the first stack of the plurality of gate structures therebetween.

In some embodiments, the ferroelectric layer may include a fluorite-based material, a nitride-based material, or a perovskite.

In some embodiments, the plurality of intermediate electrodes each may have a width of about 15 nm to about 100 nm in the first direction, and the ferroelectric layer may have a thickness of about 3 nm to about 20 nm.

In some embodiments, the plurality of channel layers may include a Group IV semiconductor material, a Group III-V semiconductor material, an oxide semiconductor material, a nitride semiconductor material, an oxynitride semiconductor material, a 2D semiconductor material, quantum dots, or an organic semiconductor material.

In some embodiments, an electronic apparatus may include the 3D ferroelectric memory device.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
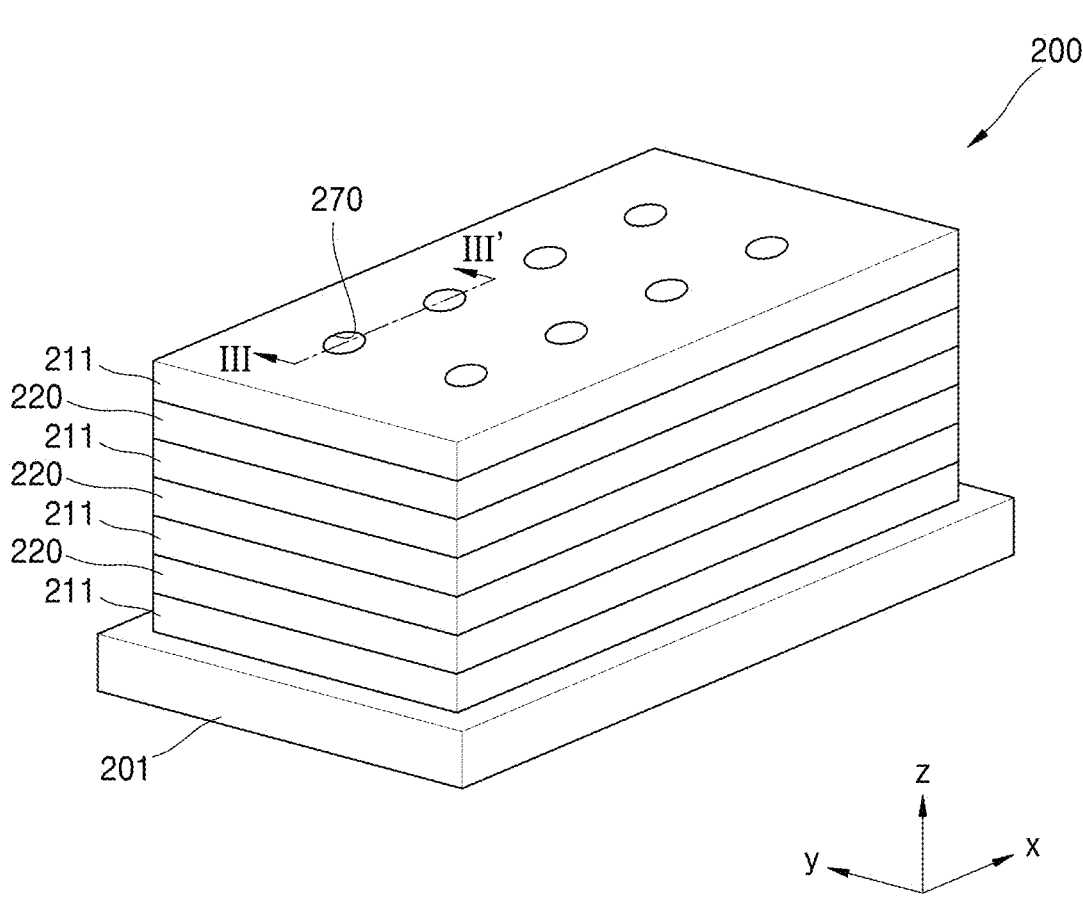
FIG. 1 is a perspective view illustrating a 3D ferroelectric memory device according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list. For example, "at least one of A, B, and C," and similar language (e.g., "at least one selected from the group consisting of A, B, and C") may be construed as A only, B only, C only, or any combination of two or more of A, B, and C, such as, for instance, ABC, AB, BC, and AC.

When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes. When ranges are specified, the range includes all values therebetween such as increments of 0.1%.

Hereinafter, example embodiments will be described with reference to the accompanying drawings. In the drawings, like reference numerals refer to like elements, and the sizes of elements may be exaggerated for clarity of illustration. The embodiments described herein are for illustrative purposes only, and various modifications may be made therein.

In the following description, when an element is referred to as being "above" or "on" another element, it may be directly on an upper, lower, left, or right side of the other element while making contact with the other element or may be above an upper, lower, left, or right side of the other element without making contact with the other element. The terms of a singular form may include plural forms unless otherwise mentioned. It will be further understood that the terms "comprises" and/or "comprising" used herein specify the presence of stated features or elements, but do not preclude the presence or addition of one or more other features or elements.

An element referred to with the definite article or a demonstrative determiner may be construed as the element or the elements even though it has a singular form. Operations of a method may be performed in an appropriate order unless explicitly described in terms of order or described to the contrary, and are not limited to the stated order thereof.

In the present disclosure, terms such as "unit" or "module" may be used to denote a unit that has at least one function or operation and is implemented with hardware, software, or a combination of hardware and software.

Furthermore, line connections or connection members between elements depicted in the drawings represent functional connections and/or physical or circuit connections by way of example, and in actual applications, they may be replaced or embodied with various additional functional connections, physical connections, or circuit connections.

Examples or example terms are just used herein to describe technical ideas and should not be considered for purposes of limitation unless defined by the claims.

FIG. 1 is a perspective view illustrating a 3D ferroelectric memory device 200 according to an example embodiment. The 3D ferroelectric memory device 200 illustrated in FIG. 1 may be, for example, a vertical NAND flash memory device.

Referring to FIG. 1, the 3D ferroelectric memory device 200 includes a plurality of memory cells stacked in a direction substantially perpendicular to a surface of a substrate 201. Here, each of the memory cells may include a ferroelectric field effect transistor (FeFET) as described later.

A vertically stacked structure in which first insulating layers 211 and gate electrodes 220 are alternately stacked in the direction (z direction) substantially perpendicular to the surface of the substrate 201 may be provided on the substrate 201. Although FIG. 1 illustrates an example in which one vertically stacked structure is provided on the substrate 201, embodiments are not limited thereto. For example, a plurality of vertically stacked structures may be provided on the substrate 201 at a distance from each other. In the vertically stacked structure, a plurality of channel holes 270 may be formed through the gate electrodes 220 and the first insulating layers 211 in the direction substantially perpendicular to the substrate 201.

The substrate 201 may include various materials. For example, the substrate 201 may include a single crystal silicon substrate, a compound semiconductor substrate, or a silicon on insulator (SOI) substrate. However, the listed materials are merely examples, and the substrate 201 may include various materials other than the listed materials. In addition, the substrate 201 may further include, for example, at least one of an impurity region formed by doping, an electronic device such as a transistor, or a peripheral circuit configured to select and control memory cells for storing data.

Figure 2:
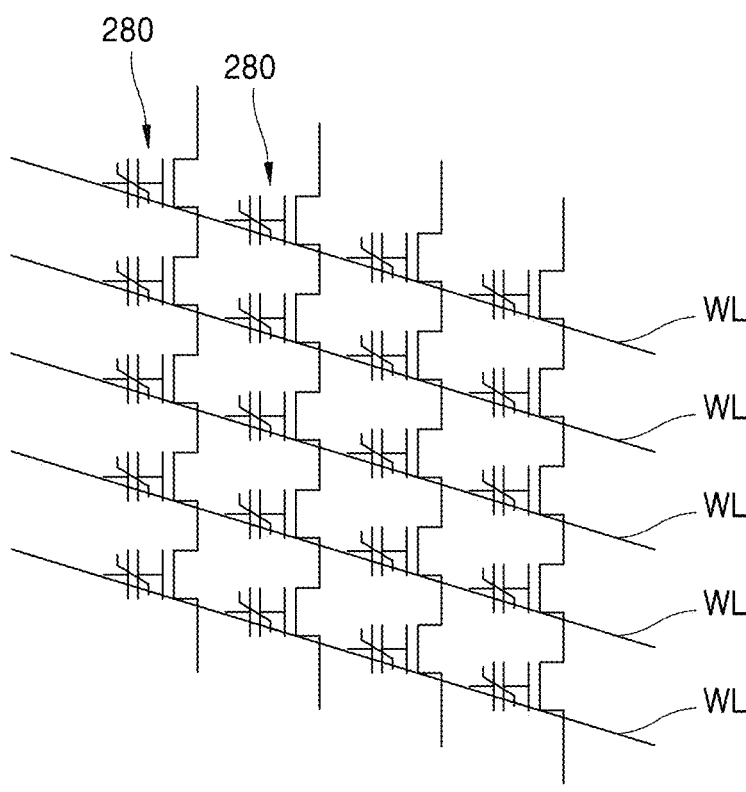
FIG. 2 is an equivalent circuit diagram of the 3D ferroelectric memory device shown in FIG. 1, according to an example embodiment.

FIG. 2 shows an equivalent circuit diagram of the 3D ferroelectric memory device 200 shown in FIG. 1, according to an example embodiment.

Figure 3:
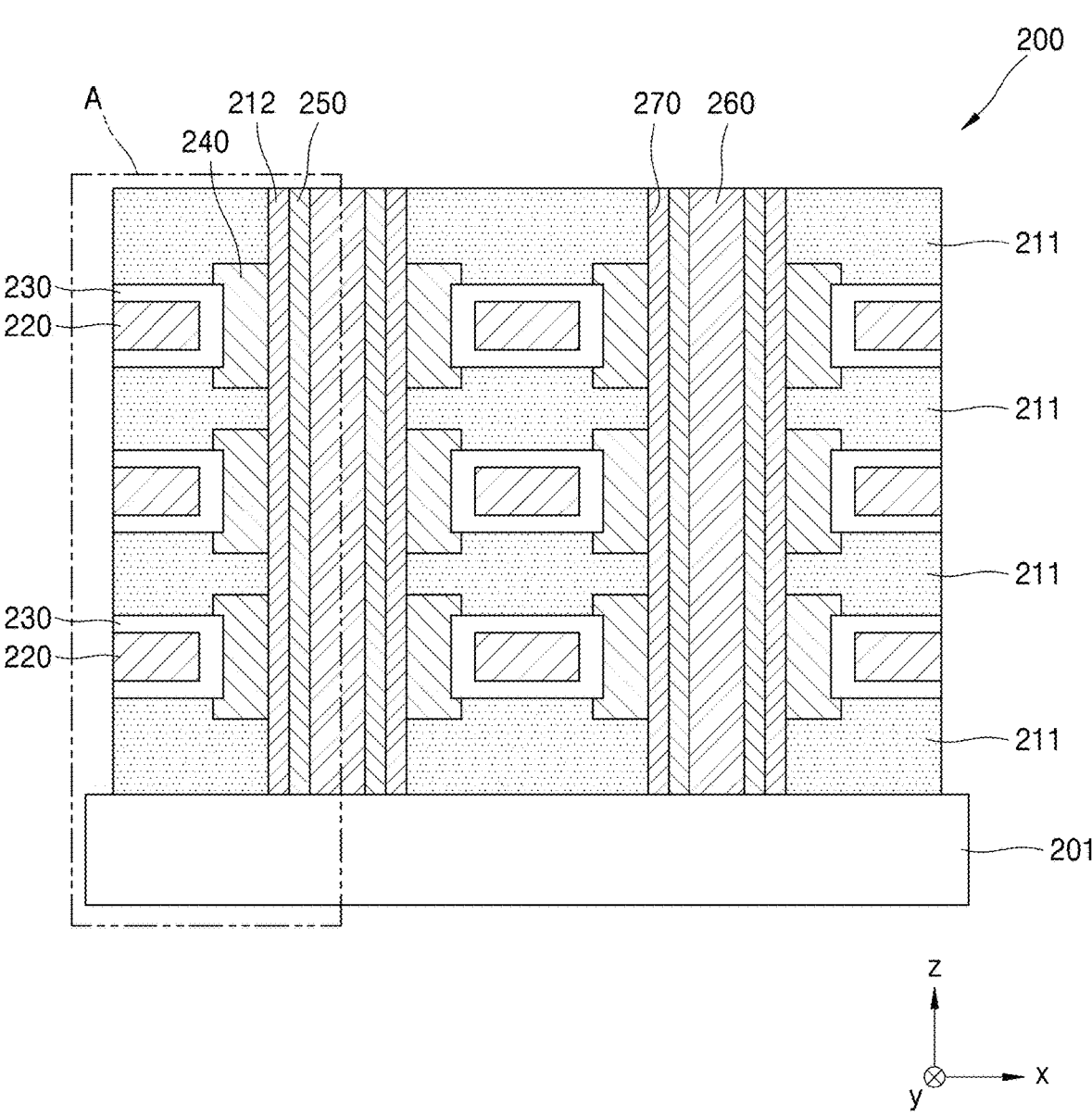
FIG. 3 is a cross-sectional view taken along line III-III' of FIG. 1.

Referring to FIG. 2, a plurality of ferroelectric field effect transistors 280 may be stacked in the direction perpendicular to the substrate 201, and each of the ferroelectric field effect transistors 280 may have a metal ferroelectric metal insulator semiconductor (MFMIS) structure including an intermediate electrode (refer to reference numeral 240 in FIG. 3). The ferroelectric field effect transistors 280 stacked in the direction perpendicular to the substrate 201 may be connected in series to each other through sources and drains, and gate electrodes 220 of the ferroelectric field effect transistors 280, which are arranged in a direction parallel to the substrate 201 may be electrically connected to word lines WL. Although not illustrated, the 3D ferroelectric memory device 200 may include a plurality of bit lines crossing the plurality of word lines. Each of the plurality of bit lines may be connected to a drain of an uppermost ferroelectric field effect transistor 280 of one or more stacks of ferroelectric field effect transistors 280. The 3D ferroelectric memory device 200 may also include a common source line connected to the source of the lowermost ferroelectric field effect transistors 280.

Figure 4:
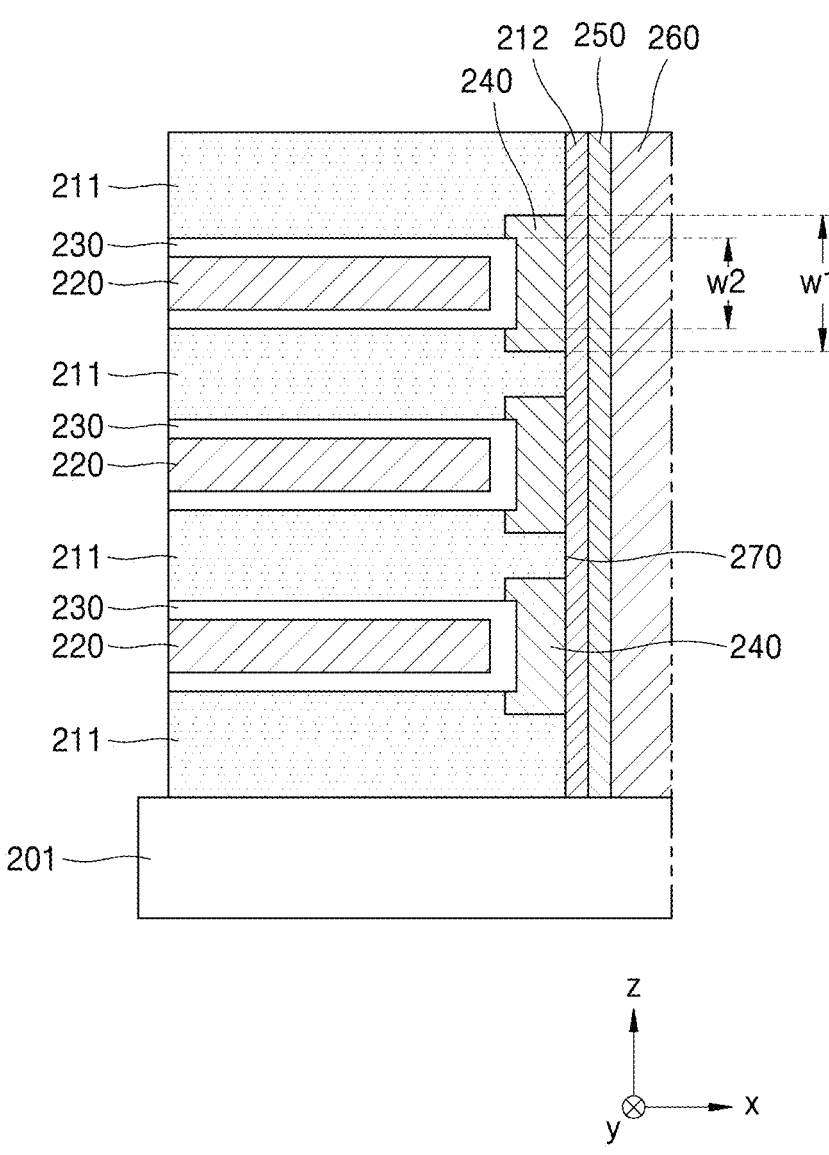
FIG. 4 is an enlarged view illustrating a portion A of FIG. 3.

FIG. 3 is a cross-sectional view taken along line III-III' of FIG. 1, and FIG. 4 is an enlarged view of a portion A of FIG. 3.

Referring to FIGS. 3 and 4, the ferroelectric field effect transistors 280 (refer to FIG. 2) having an MFMIS structure are stacked in the direction (z direction) substantially perpendicular to the substrate 201. Here, each of the ferroelectric field effect transistors 280 includes a gate electrode 220, a ferroelectric layer 230, an intermediate electrode 240, a second insulating layer (gate insulating layer) 212, and a channel layer 250.

The gate electrodes 120 are stacked in the direction perpendicular to the substrate 201, and the first insulating layers 211 are provided between the gate electrodes 120. Here, each of the gate electrodes 220 and each of the first insulating layers 211 may extend in a direction substantially parallel to the substrate 201.

The gate electrodes 220 may include a conductive material such as a metal, a metal nitride, a metal oxide, polysilicon, or the like. For example, the gate electrodes 220 may include at least one selected from the group consisting of W, TiN, TaN, WN, NbN, Mo, Ru, Ir, RuO, IrO, and polysilicon. However, the listed materials are merely examples, and the gate electrodes 220 may include various conductive materials other than the listed materials. The gate electrodes 220 may each have a thickness (thickness in the direction perpendicular to the substrate 201) within the range of about 5 nm to about 100 nm, but are not limited thereto.

The first insulating layers 211 are for insulation between the gate electrodes 220 and may include, for example, at least one selected from the group consisting of SiO, SiOC, and SiON. However, embodiments are not limited thereto. The thickness of each of the first insulating layers 211

(thickness in the direction perpendicular to the substrate 201) may be about 7 nm to about 100 nm. However, this is merely an example.

The ferroelectric layers 230 are respectively provided on the gate electrodes 220. The ferroelectric layers 230 may be provided on the gate electrodes 220 in the direction parallel to the substrate 201. The ferroelectric layers 230 may be provided on sides of the gate electrodes 220, which are perpendicular to the substrate 201. In addition, the ferroelectric layers 230 may extend from the sides of the gate electrodes 220 to cover upper and lower surfaces of the gate electrodes 220.

Ferroelectric materials have a crystalline material structure in which the charge distribution of unit cells is non-centrosymmetric, exhibiting spontaneous dipoles (electric dipoles), that is, spontaneous polarizations. In addition, ferroelectric materials have remnant polarizations due to dipoles even in the absence of an external electric field. In addition, the polarization directions of ferroelectric materials are switchable by an external electric field.

The ferroelectric layers 230 may include, for example, a fluorite-based material, a nitride-based material, or a perovskite. The nitride-based material may include, for example, AlScN, and the perovskite may include, for example, PZT, $BaTiO_3$, $PbTiO_3$, or the like. However, embodiments are not limited thereto.

For example, the fluorite-based material may include an oxide of at least one selected from the group consisting of Hf, Si, Al, Zr, Y, La, Gd, and Sr. For example, the ferroelectric layers 230 may include at least one selected from the group consisting of hafnium oxide (HfO), zirconium oxide (ZrO), and hafnium-zirconium oxide (HfZrO). In this case, the hafnium oxide (HfO), zirconium oxide (ZrO), and hafnium-zirconium oxide (HfZrO) may have an orthorhombic crystal system as a crystal structure. For example, the ferroelectric layers 230 may further include at least one dopant selected from the group consisting of Si, Al, La, Y, Sr, and Gd. The thickness of each of the ferroelectric layers 230 provided on the gate electrodes 220 may be about 3 nm to about 20 nm. However, this is merely an example.

The intermediate electrodes 240 are respectively provided on the ferroelectric layers 230. The intermediate electrodes 240 may be provided on sides of the ferroelectric layers 230, which are perpendicular to the substrate 201. Like the gate electrodes 220, the intermediate electrodes 240 may include a conductive material. For example, the intermediate electrodes 240 may include at least one selected from the group consisting of W, TiN, TaN, WN, NbN, Mo, Ru, Ir, RuO, IrO, and polysilicon. The intermediate electrodes 240 may include the same conductive material as that included in the gate electrodes 220, or may include a conductive material different from that included in the gate electrodes 220.

The intermediate electrodes 240 may extend from the sides of the ferroelectric layers 230 in the direction perpendicular to the substrate 201. The intermediate electrodes 240 may have a width W1 in the direction perpendicular to the substrate 201. In the direction perpendicular to the substrate 201, the width W1 of the intermediate electrodes 240 may be greater than a width W2 of the ferroelectric layers 130 which are in contact with the intermediate electrodes 240. In addition, contact areas between the intermediate electrodes 240 and the ferroelectric layers 230 in the direction parallel to the substrate 201 may be negligible.

For example, when the thickness of the gate electrodes 220 is about 5 nm and the thickness of the ferroelectric layers 230 is about 3 nm, the width W2 of the ferroelectric layers 230 which are in contact with the intermediate electrodes 240 in the direction perpendicular to the substrate 201 may be about 11 nm. In this case, the width W1 of the intermediate electrodes 240 in the direction perpendicular to the substrate 201 may be greater than about 11 nm and less than about 100 nm. For example, the width W1 of the intermediate electrodes 240 in the direction perpendicular to the substrate 201 may be about 15 nm to about 100 nm.

The width W1 of the intermediate electrodes 240 in the direction perpendicular to the substrate 201 may be about 1.2 times to about 5 times the width W2 of the ferroelectric layers 230 which are in contact with the intermediate electrodes 240. However, embodiments are not limited thereto.

The first insulating layers 211 are provided between the intermediate electrodes 240. Here, the first insulating layers 211 provided between the intermediate electrodes 240 may have a width of about 5 nm to about 20 nm. However, embodiments are not limited thereto. Sides of the intermediate electrodes 240 and sides of the first insulating layers 211 may form flat sides corresponding to inner walls of the channel holes 270. The intermediate electrodes 240 may have a depth which is defined from the sides of the first insulating layers 211 to the ferroelectric layers 230 in the direction parallel to the substrate 201, and thus the intermediate electrodes 240 may be in contact with the ferroelectric layers 230.

The second insulating layers 212 and the channel layers 250 are sequentially stacked on the inner walls of the channel holes 270 in the direction parallel to the substrate 201. For example, the second insulating layers 212 are provided on the sides of the first insulating layers 211 and the sides of the intermediate electrodes 240 in the direction perpendicular to the substrate 210. Here, the second insulating layers 212 may be gate insulating layers and may include, for example, at least one selected from the group consisting of SiO, SiN, AlO, HfO, and ZrO. However, embodiments are not limited thereto. The second insulating layers 212 may have a thickness of about 1 nm to about 10 nm. However, this is merely an example.

The channel layers 250 are provided on the second insulating layers 212. The channel layers 250 may be provided in the direction perpendicular to the substrate 201 and may correspond to the gate electrodes 220. Therefore, a plurality of ferroelectric field effect transistors 280 vertically stacked on the substrate 201 may share one channel layer 250.

The channel layers 250 may include a semiconductor material. For example, the channel layers 250 may include a Group IV semiconductor material such as Si, Ge, or SiGe, or may include a Group III-V semiconductor material. In addition, the channel layers 150 may include, for example, an oxide semiconductor material, a nitride semiconductor material, an oxynitride semiconductor material, a 2D semiconductor material, quantum dots (QDs), or an organic semiconductor material. Here, the oxide semiconductor material may include, for example, InGaZnO, or the like; the 2D semiconductor material may include, for example, a transition metal dichalcogenide (TMD) or graphene; and the QDs may include colloidal QDs, nanocrystal QDs, or the like. However, the listed materials are merely examples, and embodiments are not limited thereto.

The channel layers 250 may further include a dopant. Here, the dopant may include a p-type dopant or an n-type dopant. The p-type dopant may include, for example, a Group III element such as B, Al, Ga, In, or the like, and the n-type dopant may include, for example, a Group V element such as P, As, or Sb.

The channel layers 250 may have a thickness of about 1 nm to 20 nm, but are not limited thereto. Oxide layers 260 may be further provided on the channel layers 250 to fill the channel holes 270.

The ferroelectric polarization direction of each of the ferroelectric field effect transistors 280 may be determined by a gate voltage applied to the gate electrode 220 of the ferroelectric field effect transistor 280 such that the ferroelectric field effect transistor 280 may perform a memory operation. Here, a gate voltage inducing an electric field stronger than a coercive field in which ferroelectric polarization switching occurs may be applied to the gate electrode 220 for a nonvolatile memory operation.

In the 3D ferroelectric memory device 200 of the embodiments, the intermediate electrodes 240 are provided between the ferroelectric layers 230 and the second insulating layers 212 serving as gate insulating layers, and the width of the intermediate electrodes 240 is greater than the width of the ferroelectric layers 230 which are in contact with the intermediate electrodes 240 such that the ratio of the capacitance of the ferroelectric layers 230 provided between the gate electrodes 220 and the intermediate electrodes 240 to the capacitance of the second insulating layers 212 provided between the intermediate electrodes 240 and the channel layers 250 may be adjusted. Thus, the reliability of the 3D ferroelectric memory device 200 may be improved.

In the 3D ferroelectric memory device 200, the width of the intermediate electrodes 240 is greater than the width of the ferroelectric layers 230 which are in contact with the intermediate electrodes 240, and thus the contact area between the intermediate electrodes 240 and the second insulating layers 212 serving as gate insulating layers may be greater than the contact area between the intermediate electrodes 240 and the ferroelectric layers 230. Therefore, the ratio of the capacitance of the second insulating layers 212 to the capacitance of the ferroelectric layers 230 may be increased, and thus it may be possible to decrease an electric field applied to the second insulating layers 212. As a result, deterioration of the second insulating layers 212 may be limited and/or prevented, and the 3D ferroelectric memory device 200 may be easily driven even with a relatively low voltage.

Hereinafter, a method of manufacturing the 3D ferroelectric memory device 200 will be described. FIGS. 5 to 12 are views illustrating a method of manufacturing the 3D ferroelectric memory device 200 according to an example embodiment.

Figure 5:
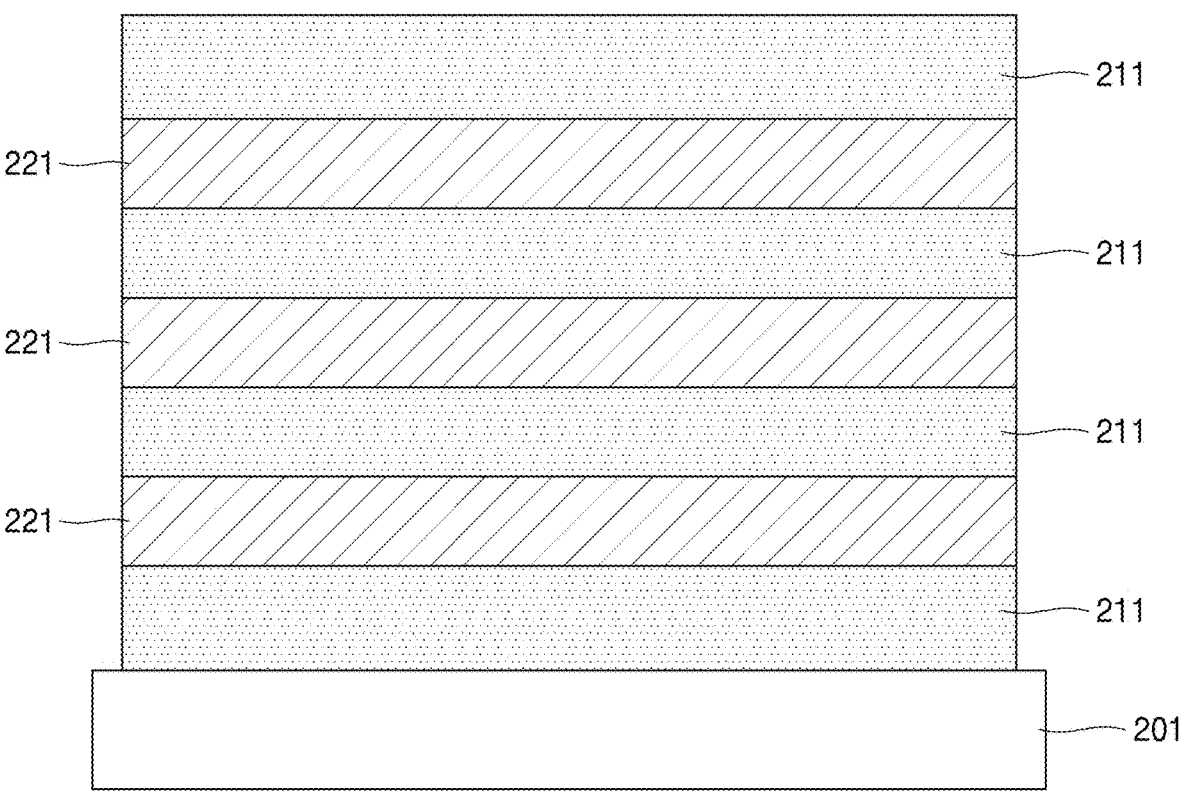
FIGS. 5 to 12 are views illustrating a method of manufacturing a 3D ferroelectric memory device according to an example embodiment.

Referring to FIG. 5, a plurality of first insulating layers 211 and a plurality of sacrificial layers 221 are alternately stacked in a direction perpendicular to a substrate 201. The substrate 201 may include various materials. For example, the substrate 201 may include a single crystal silicon substrate, a compound semiconductor substrate, or an SOI substrate. However, the listed materials are merely examples, and the substrate 201 may include various materials other than the listed materials. In addition, the substrate 201 may further include, for example, at least one of an impurity region formed by doping, an electronic device such as a transistor, or a peripheral circuit configured to select and control memory cells for storing data.

The first insulating layers 211 may include, for example, at least one selected from the group consisting of SiO, SiOC, and SiON, but are not limited thereto. The first insulating layers 211 may have a thickness of, for example, about 7 nm to about 100 nm. However, this is merely an example. The sacrificial layers 221 may include a material having etch selectivity to the first insulating layers 211. For example, the sacrificial layers 221 may include SiN, but are not limited thereto.

Figure 6:
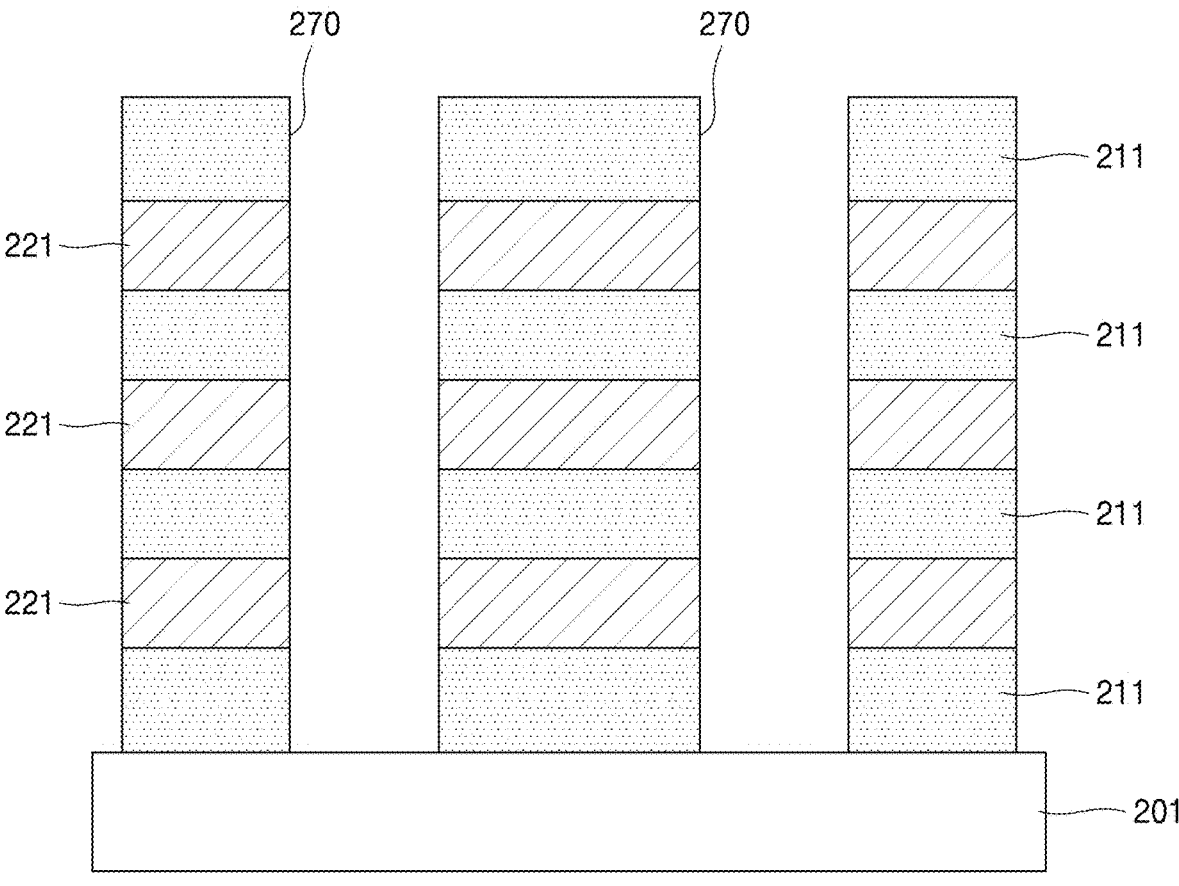

Referring to FIG. 6, channel holes 270 are formed through the first insulating layers 211 and the sacrificial layers 221. Here, the channel holes 270 may be formed in a direction substantially perpendicular to the substrate 201. Sides of the first insulating layers 211 and the sacrificial layers 221 may be exposed through inner walls of the channel holes 270.

Figure 7:
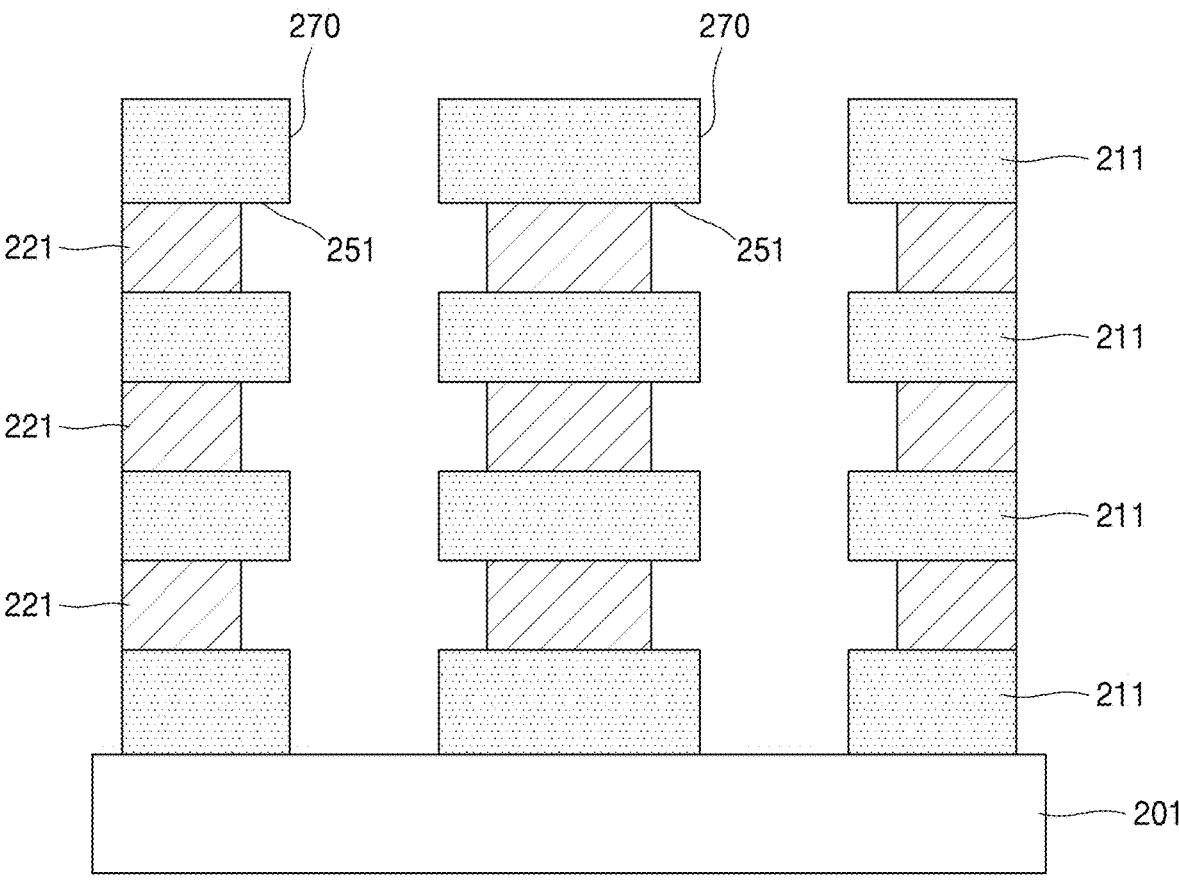

Referring to FIG. 7, the sides of the sacrificial layers 221 exposed through the channel holes 270 are etched to a given depth in a direction parallel to the substrate 201, thereby forming first recesses 251.

Figure 8:
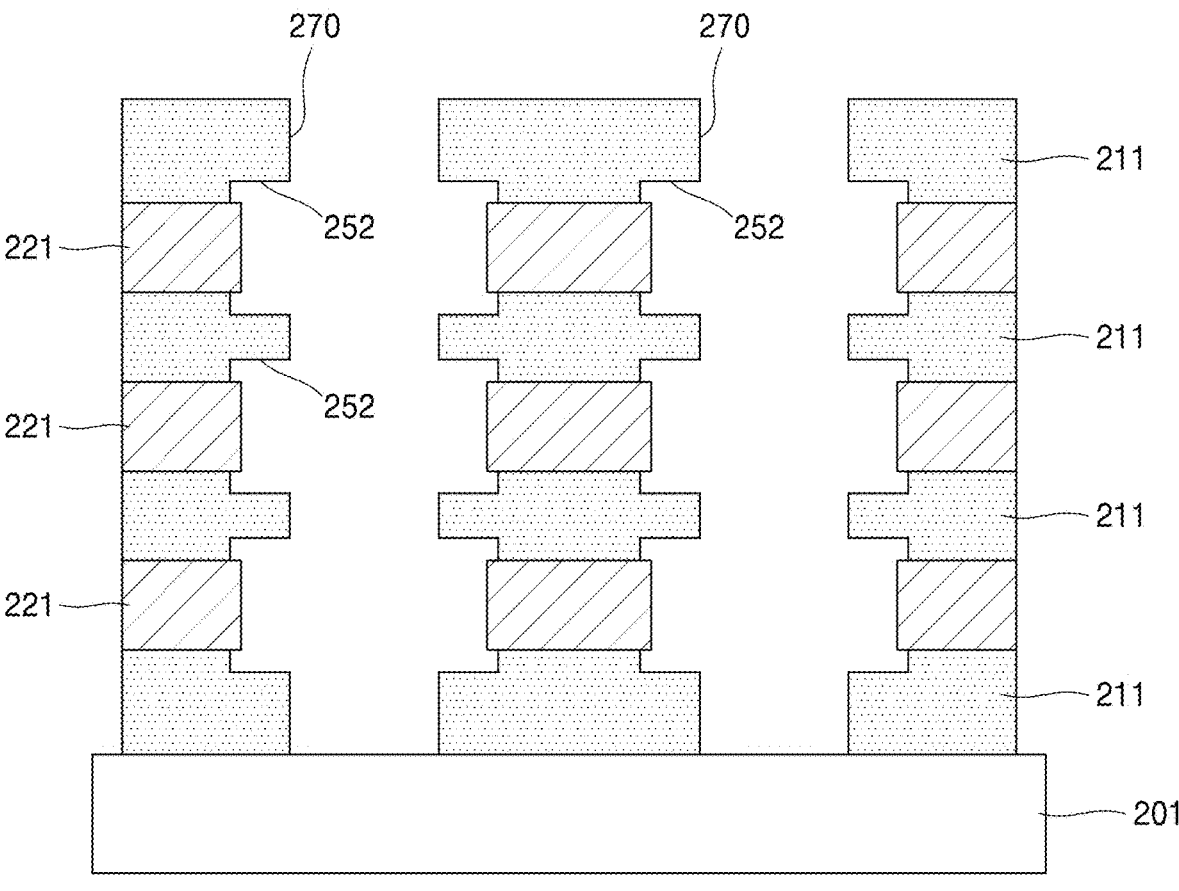

Referring to FIG. 8, portions of the first insulating layers 211 exposed through the first recesses 251 are etched to form second recesses 252. The second recesses 252 may extend from the first recesses 251 in the direction perpendicular to the substrate 201. Therefore, in the direction perpendicular to the substrate 201, the width of the second recesses 252 may be greater than the width of the sacrificial layers 221. For example, in the direction perpendicular to the substrate 201, the width of the second recesses 252 may be about 1.2 times to about 5 times the width of the sacrificial layers 221. However, this is merely an example.

Figure 9:
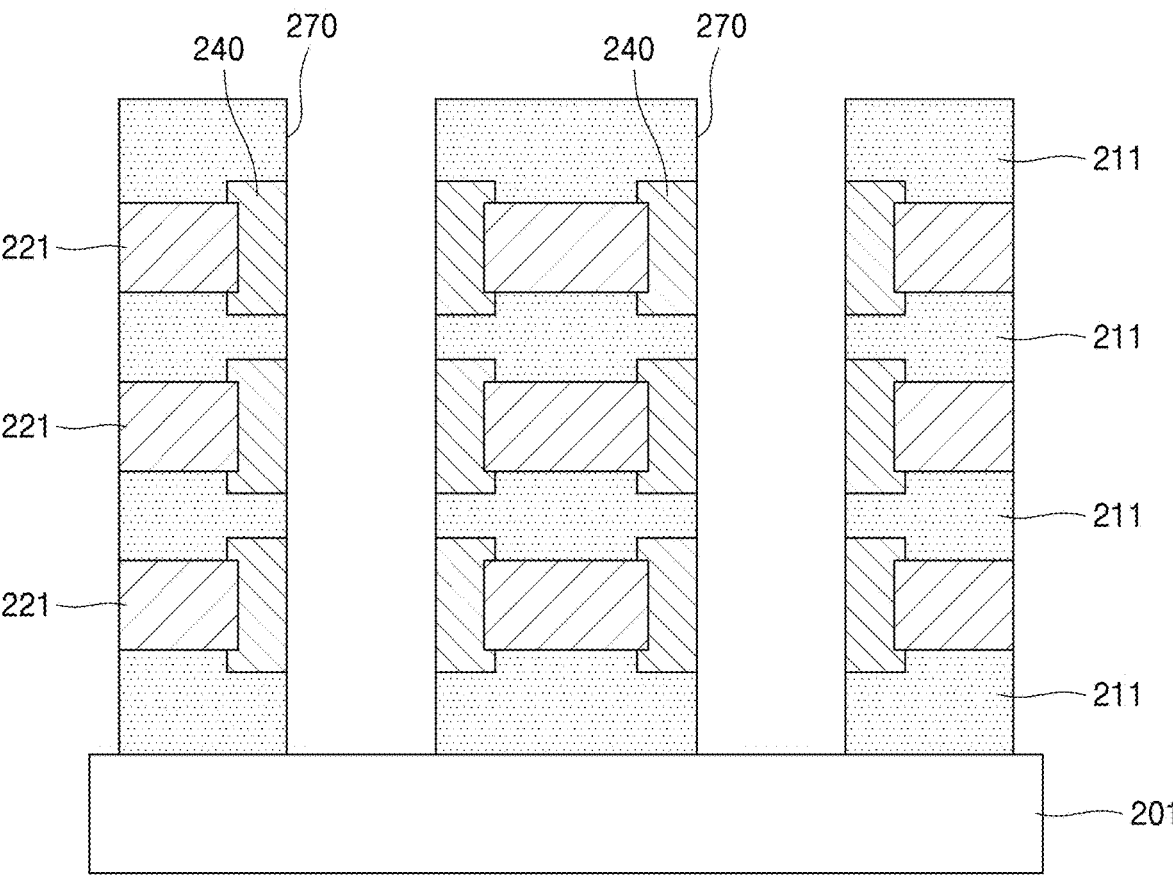

Referring to FIG. 9, intermediate electrodes 240 are deposited to fill the second recesses 252. Here, in the direction perpendicular to the substrate 201, the width of the intermediate electrodes 240 may be greater than the width of the sacrificial layers 221. The intermediate electrodes 240 may include, for example, at least one selected from the group consisting of W, TiN, TaN, WN, NbN, Mo, Ru, Ir, RuO, IrO, and polysilicon, but are not limited thereto. Sides of the intermediate electrodes 240 and sides of the first insulating layers 211 may form flat sides corresponding to the inner walls of the channel holes 270.

Figure 10:
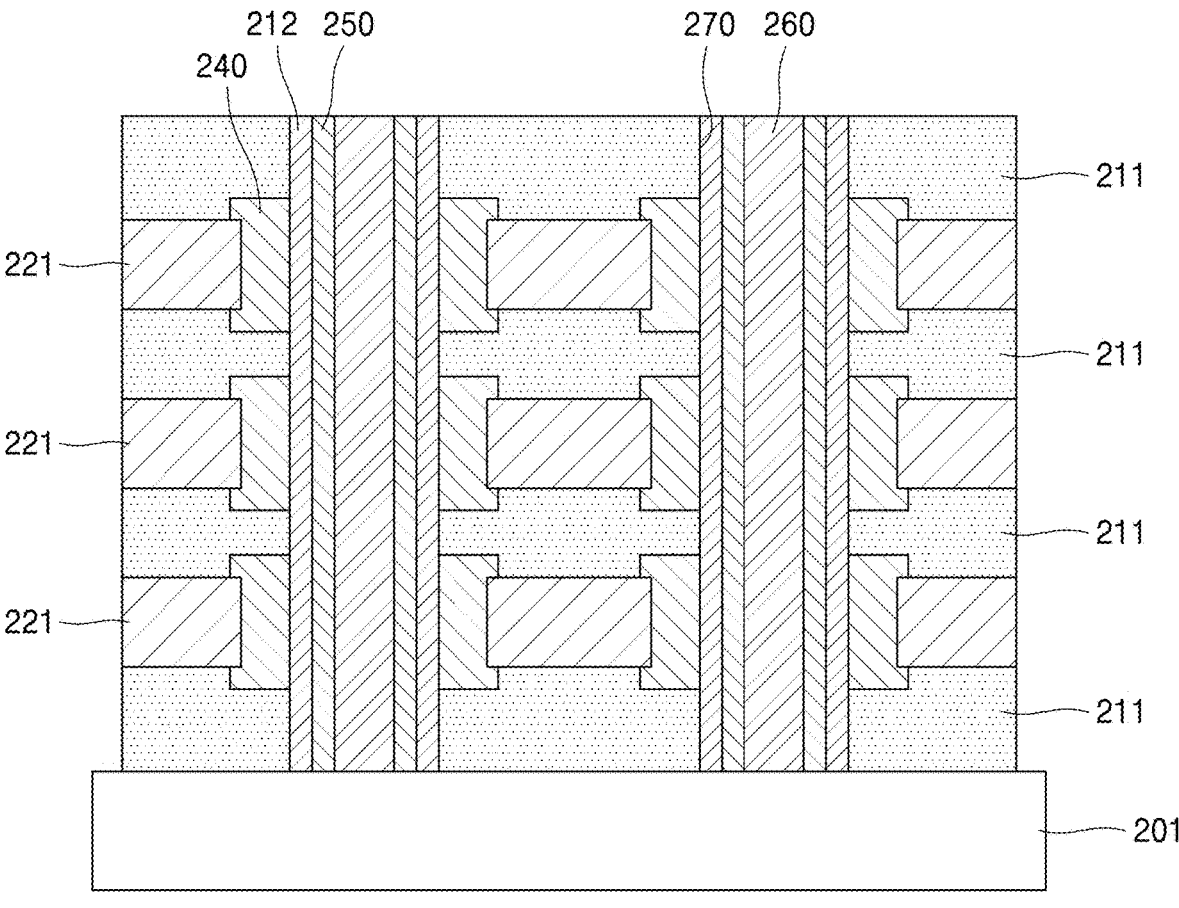

Referring to FIG. 10, second insulating layers 212 and channel layers 250 are sequentially deposited on the inner walls of the channel holes 270. The second insulating layers 212 may be gate insulating layers and may include, for example, at least one selected from the group consisting of SiO, SiN, AlO, HfO, and ZrO. The second insulating layers 212 may have a thickness of about 1 nm to about 10 nm. However, this is merely an example.

The channel layers 250 may be formed on the second insulating layers 212. The channel layers 250 may include a semiconductor material. For example, the channel layers 250 may include a Group IV semiconductor material such as Si, Ge, or SiGe, or may include a Group III-V semiconductor material. In addition, the channel layers 250 may include, for example, an oxide semiconductor material, a nitride semiconductor material, an oxynitride semiconductor material, a 2D semiconductor material, QDs, or an organic semiconductor material. Here, the oxide semiconductor material may include, for example, InGaZnO, or the like; the 2D semiconductor material may include, for example, a TMD or graphene; and the QDs may include colloidal QDs, nanocrystal QDs, or the like. However, the listed materials are merely examples, and embodiments are not limited thereto.

The channel layers 250 may further include a dopant. Here, the dopant may include a p-type dopant or an n-type dopant. The channel layers 250 may have a thickness of about 1 nm to 20 nm, but is not limited thereto. Oxide layers 260 may be further formed on the channel layers 250 to fill the channel holes 270.

Figure 11:
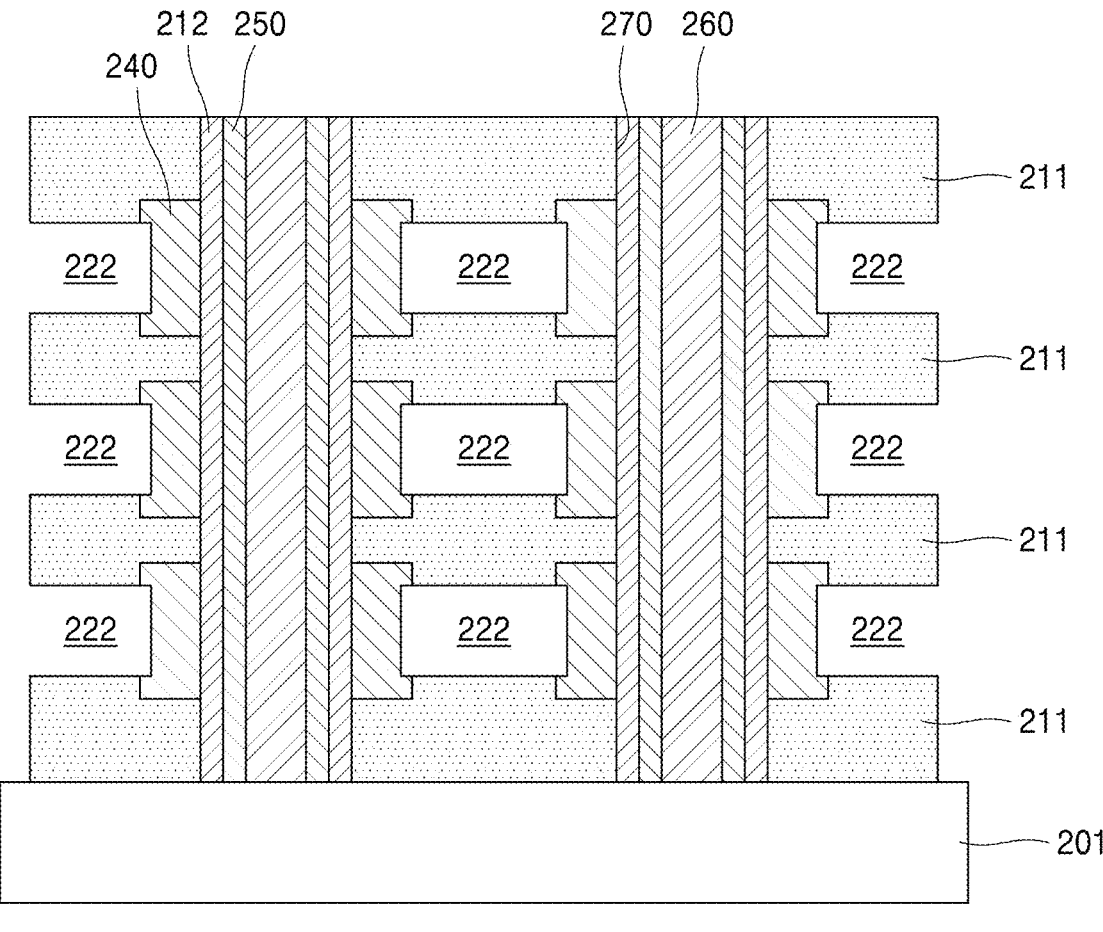

Referring to FIG. 11, the sacrificial layers 221 may be removed by etching. Then, the intermediate electrodes 240 are exposed through spaces 222 from which the sacrificial layers 221 are removed.

Figure 12:
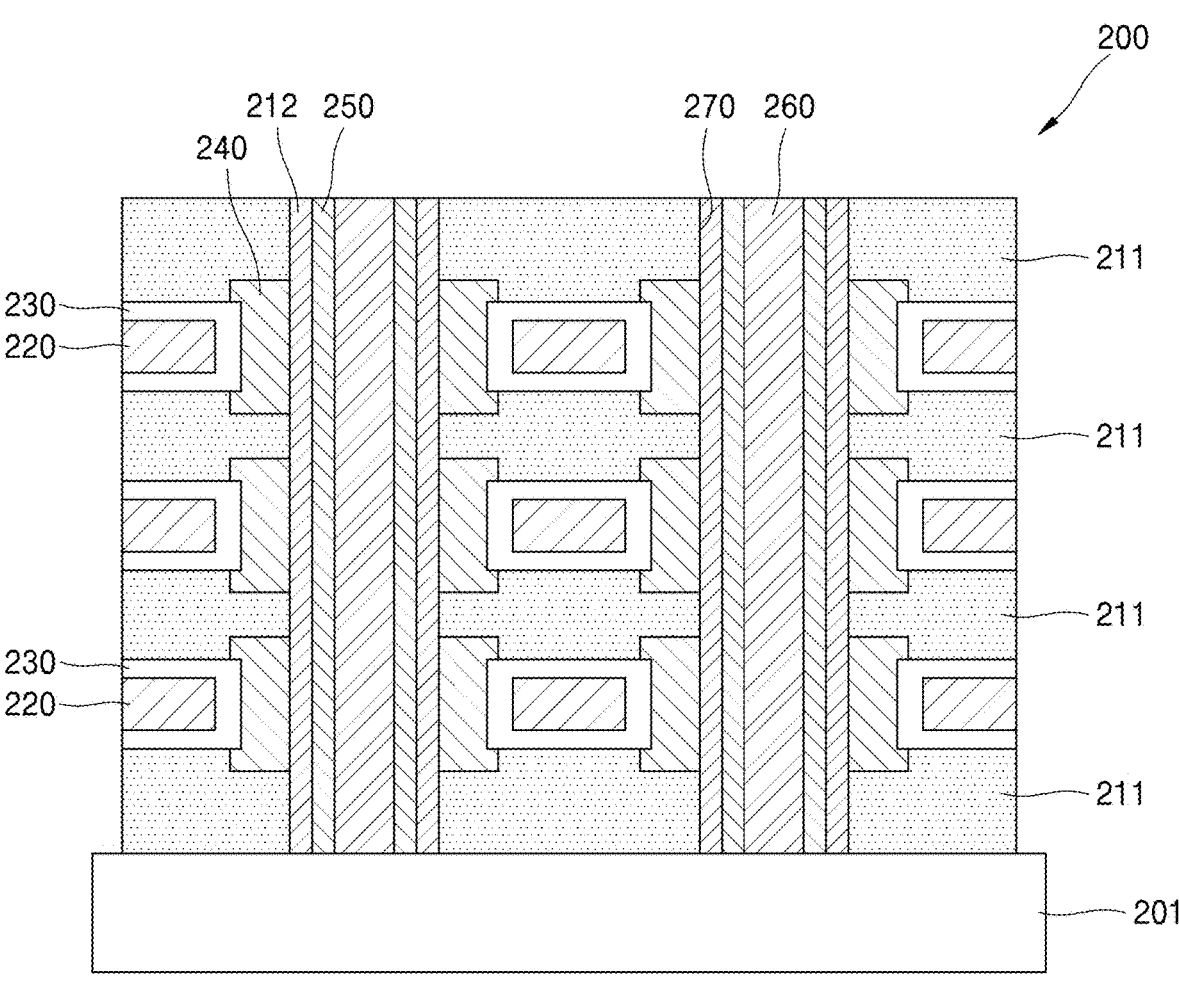

Referring to FIG. 12, ferroelectric layers 230 are deposited on inner walls of the spaces 222 from which the sacrificial layers 221 are removed, and then gate electrodes 220 are formed inside the ferroelectric layers 230.

The ferroelectric layers 230 may include, for example, a fluorite-based material, a nitride-based material, or a perovskite. The nitride-based material may include, for example, AlScN, and the perovskite may include, for example, PZT, BaTiO_3, PbTiO_3, or the like. However, embodiments are not limited thereto.

For example, the fluorite-based material may include an oxide of at least one selected from the group consisting of Hf, Si, Al, Zr, Y, La, Gd, and Sr. For example, the ferroelectric layers 230 may include at least one selected from the group consisting of hafnium oxide (HfO), zirconium oxide (ZrO), and hafnium-zirconium oxide (HfZrO). In this case, the hafnium oxide (HfO), zirconium oxide (ZrO), and hafnium-zirconium oxide (HfZrO) may have an orthorhombic crystal system as a crystal structure. For example, the ferroelectric layers 230 may further include at least one dopant selected from the group consisting of Si, Al, La, Y, Sr, and Gd. The thickness of each of the ferroelectric layers 230 provided on the gate electrodes 220 may be about 3 nm to about 20 nm. However, this is merely an example.

Gate electrodes 220 are formed inside the ferroelectric layers 230. The gate electrodes 220 may include, for example, at least one selected from the group consisting of W, TiN, TaN, WN, NbN, Mo, Ru, Ir, RuO, IrO, and polysilicon. However, the listed materials are merely examples. The gate electrodes 220 may each have a thickness (e.g., thickness in the direction perpendicular to the substrate 201) within the range of about 5 nm to about 100 nm, but are not limited thereto.

FIGS. 13A to 13D are views illustrating operations in a method of manufacturing a 3D ferroelectric memory device according to an example embodiment.

Figure 13A:
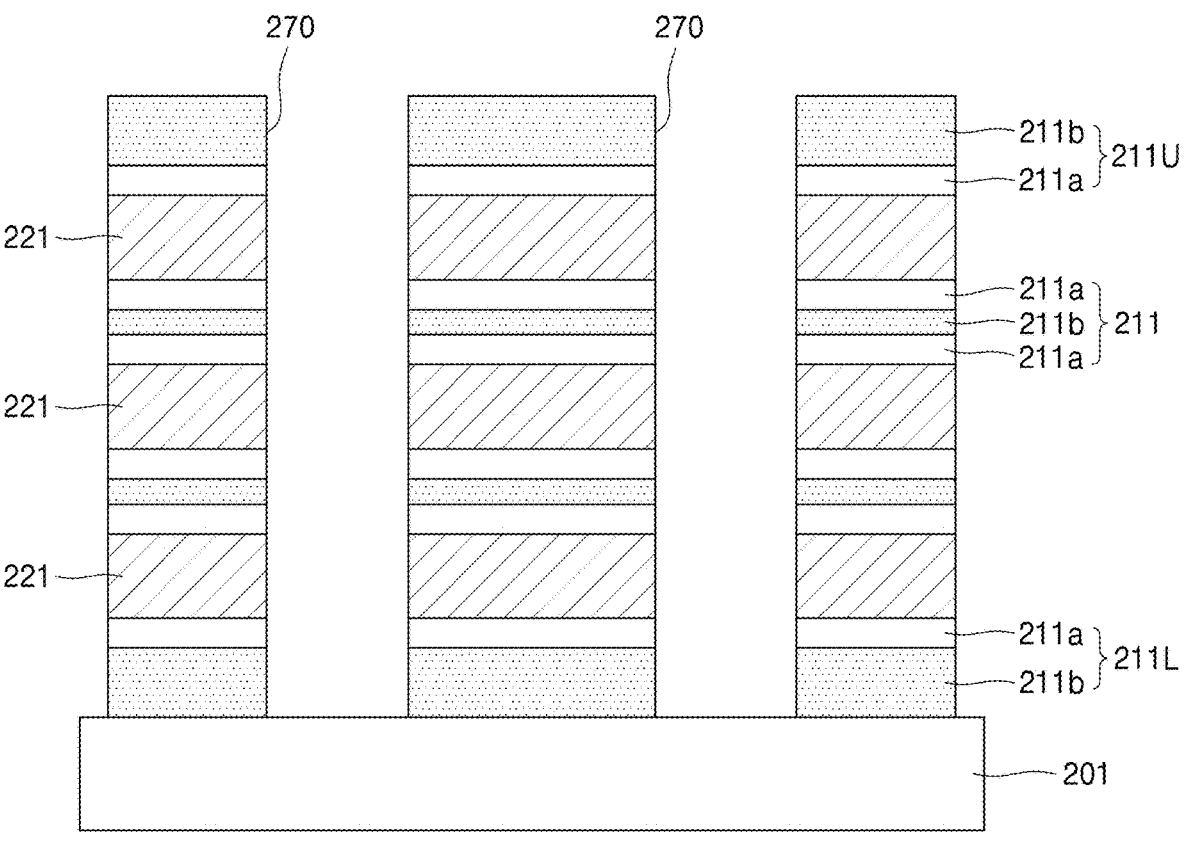
FIGS. 13A to 13D are views illustrating operations in a method of manufacturing a 3D ferroelectric memory device according to an example embodiment.

Referring to FIG. 13A, a method of manufacturing a 3D ferroelectric memory device may be similar to the method in FIGS. 5 to 12 except for a structure of the first insulating layers 211. A plurality of first insulating layers 211 and a plurality of sacrificial layers 221 may be alternately stacked on the substrate 201 and patterned to form the channel holes 270 similar to the operations in FIGS. 5 to 6. However, as shown in FIG. 13A, each of the first insulating layers 211 may include a multi-layer structure including a first insulating film 211a on at least one surface of a second insulating film 211b. The first insulating film 211a and second insulating film 211b may include films having different materials selected from the group consisting of SiO, SiOC, and SiON. The lowermost first insulating layer 211L and uppermost first insulating layer 211U each may include one first insulating film 211a and one second insulating film 211b. The first insulating film 211a may be on an upper surface of the second insulating film 211b in the lowermost first insulating layer 211L and the first insulating film 211a may contact the lower surface of the second insulating film 211b in the uppermost first insulating layer 211U. Other first insulating layers 211 may include the first insulating film 211a on the lower surface and the upper surface of the second insulating film 211b.

Figure 13B:
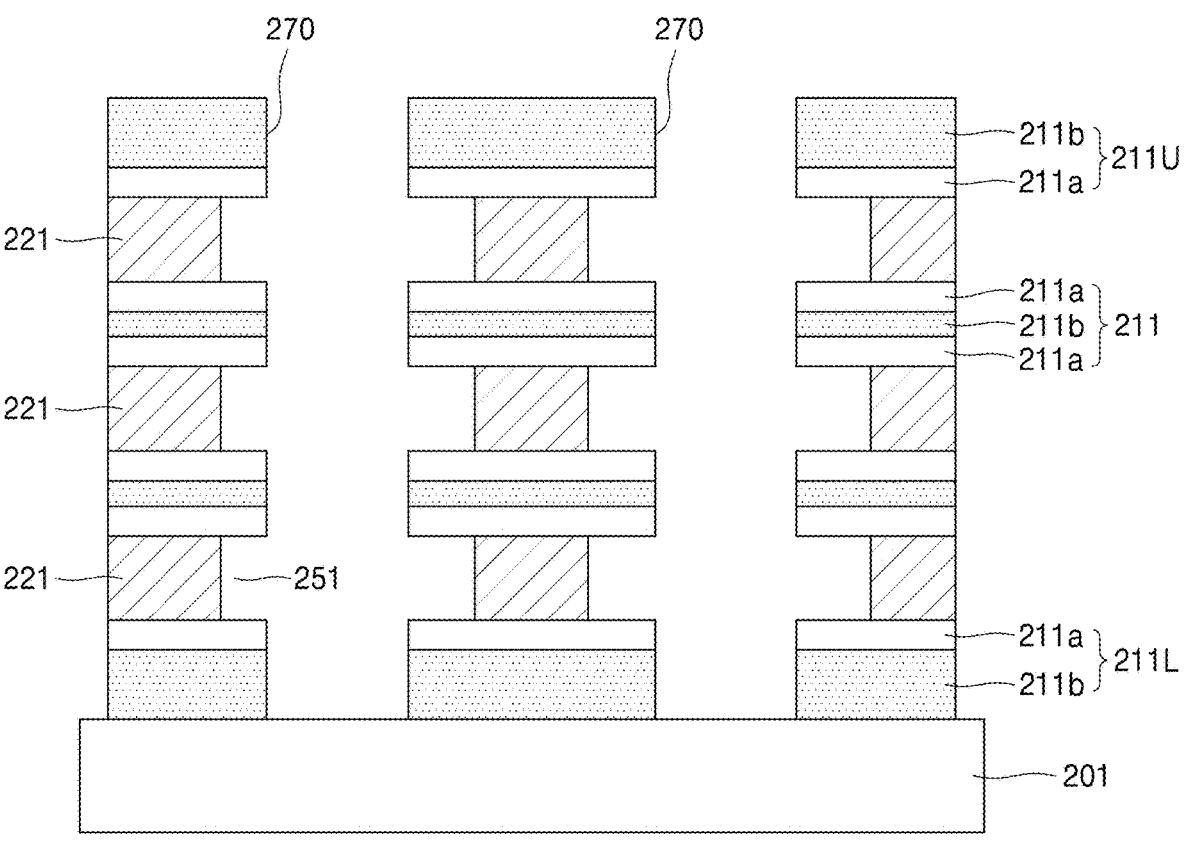

Referring to FIG. 13B, like the operation described in relation to FIG. 7, sides of the sacrificial layers 221 may be etched to form first recesses 251.

Figure 13C:
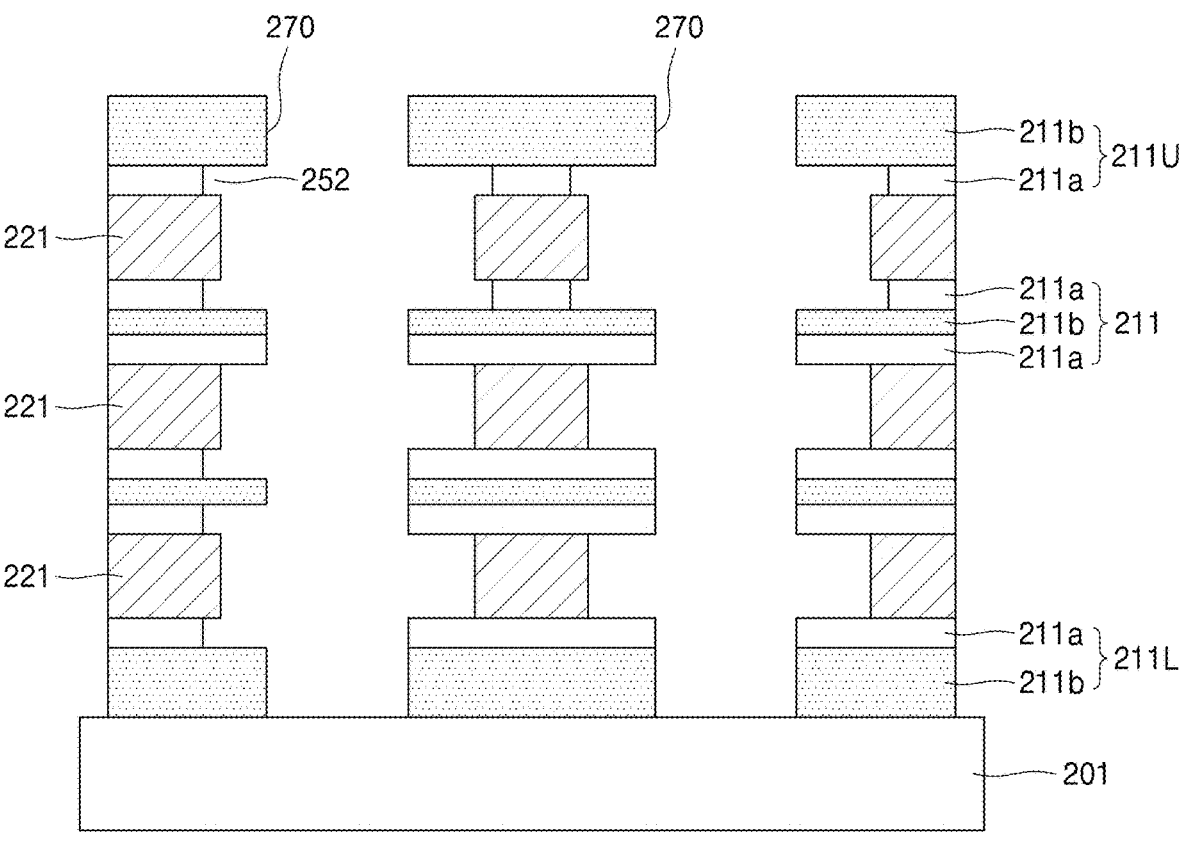

Referring to FIG. 13C, like the operation described in relation to FIG. 8, portions of the first insulating films 211a may be selectively etched to form second recesses 252.

Figure 13D:
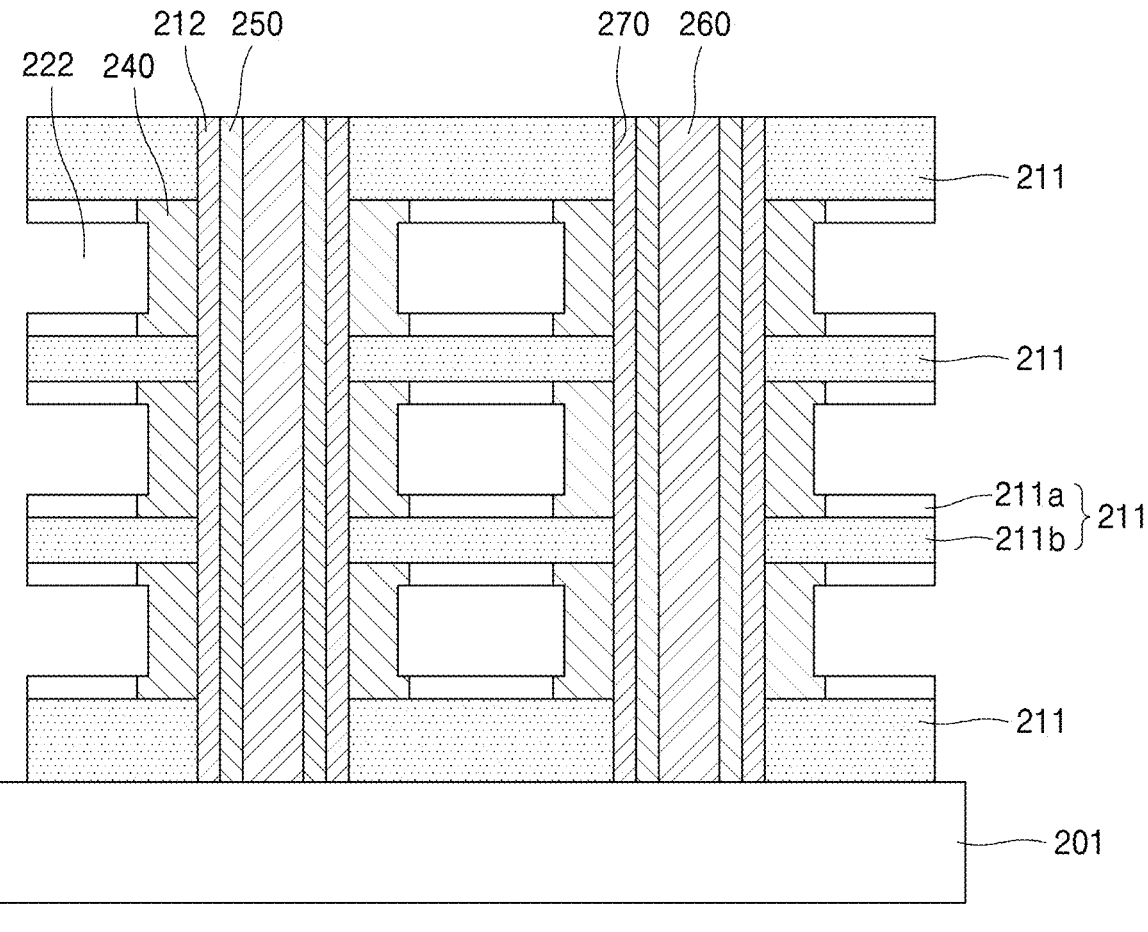

Referring to FIG. 13D, like the operation described in relation to FIG. 9, intermediate electrodes 240 may be formed to fill the second recesses 252. Thereafter, like the operation described in relation to FIGS. 9-10, second insulating layers 212 and channel layers 250 may be sequentially deposited on the inner walls of the channel holes 270. Thereafter, the sacrificial layers 221 may be removed to form through spaces 222 exposing the intermediate electrodes 240. Although not illustrated in FIG. 13D, ferroelectric layers 230 may be deposited on inner walls of the spaces 222 and then gate electrodes 220 may be formed inside the ferroelectric layers 230 to form ferroelectric layers 230 and gate electrodes 220 like those shown in FIG. 3.

Figure 14:
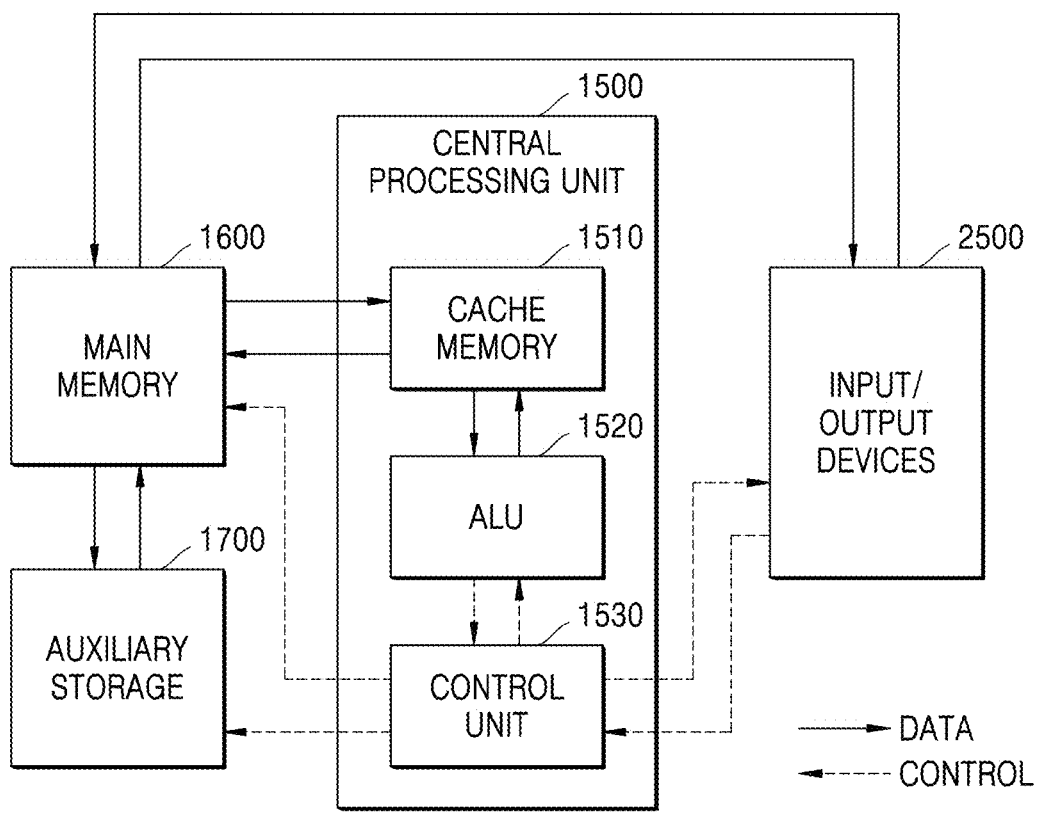
FIG. 14 is a conceptual view schematically illustrating a device architecture applicable to an electronic apparatus according to an example embodiment.

The 3D ferroelectric memory device 200 described above may be used in various electronic apparatuses to store data. FIG. 14 is a conceptual view schematically illustrating a device architecture applicable to an electronic apparatus according to an example embodiment.

Referring to FIG. 14, a cache memory 1510, an ALU 1520, and a control unit 1530 may form a central processing unit (CPU) 1500, and the cache memory 1510 may be a static random access memory (SRAM). A main memory 1600 and an auxiliary storage 1700 may be provided separately from the CPU 1500. The main memory 1600 may include a DRAM device, and the auxiliary storage 1700 may include the 3D ferroelectric memory device 200 described above. In some cases, the device architecture may be implemented in the form in which unit computing devices and unit memory devices are adjacent to each other in one chip without any distinction between sub-units.

As described above, according to the one or more of the above example embodiments, in the 3D ferroelectric memory device 200, the width of the intermediate electrodes 240 is greater than the width of the ferroelectric layers 230 which are in contact with the intermediate electrodes 240, and thus the contact area between the intermediate electrodes 240 and the second insulating layers 212 serving as gate insulating layers may be greater than the contact area between the intermediate electrodes 240 and the ferroelectric layers 230. Therefore, the ratio of the capacitance of the second insulating layers 212 to the capacitance of the ferroelectric layers 230 may be increased, and thus it may be possible to decrease an electric field applied to the second insulating layers 212. As a result, deterioration of the second insulating layers 212 may be limited and/or prevented, and the 3D ferroelectric memory device 200 may be easily driven even with a relatively low voltage.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A 3D ferroelectric memory device comprising:
a substrate;
a plurality of gate electrodes stacked on the substrate in a first direction;
a plurality of ferroelectric layers on the plurality of gate electrodes in a second direction;
a plurality of intermediate electrodes on the plurality of ferroelectric layers in the second direction;
a first insulating layer between the plurality of gate electrodes and between the plurality of intermediate electrodes, wherein the first insulating layer vertically overlaps the plurality of gate electrodes, the first insulating layer vertically overlaps the plurality of intermediate electrodes, and the first insulating layer directly separates the plurality of intermediate electrodes;
a second insulating layer on the plurality of intermediate electrodes and the first insulating layer; and
a channel layer on the second insulating layer.

2. The 3D ferroelectric memory device of claim 1, wherein
the first direction is a direction substantially perpendicular to a surface of the substrate, and
the second direction is a direction substantially parallel to the surface of the substrate.

3. The 3D ferroelectric memory device of claim 2, wherein
the plurality of intermediate electrodes have depths in the direction substantially parallel to the surface of the substrate, and
the plurality of intermediate electrodes are in contact with the plurality of ferroelectric layers.

4. The 3D ferroelectric memory device of claim 1, wherein contact areas between the plurality of ferroelectric layers and the plurality of intermediate electrodes are less than contact areas between the second insulating layer and the plurality of intermediate electrodes.

5. The 3D ferroelectric memory device of claim 4, wherein in the first direction, the plurality of intermediate electrodes have widths greater than widths of portions of the plurality of ferroelectric layers in contact with the plurality of intermediate electrodes.

6. The 3D ferroelectric memory device of claim 5, wherein
in the first direction, the widths of the plurality of intermediate electrodes are about 1.2 times to about 5 times the widths of the portions of the plurality of ferroelectric layers in contact with the plurality of intermediate electrodes.

7. The 3D ferroelectric memory device of claim 5, wherein the plurality of intermediate electrodes each have a width of about 15 nm to about 100 nm in the first direction.

8. The 3D ferroelectric memory device of claim 1, wherein the plurality of gate electrodes and the plurality of intermediate electrodes each independently comprise at least one of W, TiN, TaN, WN, NbN, Mo, Ru, Ir, RuO, IrO, and polysilicon.

9. The 3D ferroelectric memory device of claim 1, wherein the first insulating layer comprises at least one of SiO, SiOC, and SiON.

10. The 3D ferroelectric memory device of claim 1, wherein the plurality of ferroelectric layers surround the plurality of gate electrodes.

11. The 3D ferroelectric memory device of claim 1, wherein the plurality of ferroelectric layers comprise a fluorite-based material, a nitride-based material, or a perovskite.

12. The 3D ferroelectric memory device of claim 1, wherein the plurality of ferroelectric layers each have a thickness of about 3 nm to about 20 nm.

13. The 3D ferroelectric memory device of claim 1, wherein the first insulating layer has a width between the plurality of intermediate electrodes within a range of about 5 nm to about 20 nm.

14. The 3D ferroelectric memory device of claim 1, wherein the second insulating layer comprises at least one of SiO, SiN, AlO, HfO, and ZrO.

15. The 3D ferroelectric memory device of claim 1, wherein the channel layer comprises a Group IV semiconductor material, a Group III-V semiconductor material, an oxide semiconductor material, a nitride semiconductor material, an oxynitride semiconductor material, a 2D semiconductor material, quantum dots, or an organic semiconductor material.

16. An electronic apparatus comprising:
the 3D ferroelectric memory device of claim 1.

17. A 3D ferroelectric memory device comprising:
a substrate;
a plurality of channel layers spaced apart from each other on a surface of the substrate,
the plurality of channel layers including a first channel layer and a second channel layer spaced apart from each other in a first direction,
the first direction parallel to the surface of the substrate and crossing a second direction that is parallel to the surface of the substrate, and
the plurality of channel layers extending in a third direction that is perpendicular to the surface of the substrate;
a plurality of gate insulating layers on the surface of the substrate and extending along the plurality of channel layers, respectively, in the third direction,
the plurality of gate insulating layers including a first gate insulating layer and a second gate insulating layer extending along the first channel layer and the second channel layer, respectively, and
the first gate insulating layer and the second gate insulating layer being between the first channel layer and the second channel layer in the first direction;
a plurality of gate structures spaced apart from each other on the surface of the substrate, each of the plurality of gate structures including a ferroelectric layer covering a gate electrode such that the plurality of gate structures include a plurality of gate electrodes, and
a first stack of the plurality of gate structures being spaced apart from each other in the third direction and spaced apart from the first gate insulating layer and the second gate insulating layer in the first direction;
a plurality of intermediate electrodes spaced apart from each other on the surface of the substrate,
widths of the plurality of intermediate electrodes in the third direction being greater than widths of the plurality of gate structures in the third direction,
a first stack of the plurality of intermediate electrodes being spaced apart from each other in the third direction along the first gate insulating layer, a second stack of the plurality of intermediate electrodes being spaced apart from each other in the third direction along the second gate insulating layer, and the first stack of the plurality of intermediate electrodes being spaced apart from the second stack of the plurality of intermediate electrodes in the first direction with the first stack of the plurality of gate structures therebetween; and a plurality of insulating films alternately arranged with the plurality of gate structures on the surface of the substrate, wherein each of the plurality of insulating films extends in the first direction between two of the plurality of gate structures that are separated in the third direction and two of the plurality of intermediate electrodes that are separated in the third direction, the plurality of insulating films vertically overlap the plurality of gate electrodes and the plurality of intermediate electrodes, and the plurality of insulating films directly separate the plurality of intermediate electrodes from each other.

18. The 3D ferroelectric memory device of claim 17, wherein the ferroelectric layer comprises a fluorite-based material, a nitride-based material, or a perovskite.

19. The 3D ferroelectric memory device of claim 17, wherein the plurality of intermediate electrodes each have a width of about 15 nm to about 100 nm in the first direction, and the ferroelectric layer has a thickness of about 3 nm to about 20 nm.

20. The 3D ferroelectric memory device of claim 17, wherein the plurality of channel layers comprise a Group IV semiconductor material, a Group III-V semiconductor material, an oxide semiconductor material, a nitride semiconductor material, an oxynitride semiconductor material, a 2D semiconductor material, quantum dots, or an organic semiconductor material.

\* \* \* \* \*